(12) United States Patent
Ziglioli

(10) Patent No.: US 9,640,506 B2
(45) Date of Patent: May 2, 2017

(54) METHOD FOR MANUFACTURING ELECTRONIC DEVICES

(71) Applicant: STMicroelectronics S.r.l., Agrate Brianza (IT)

(72) Inventor: Federico Giovanni Ziglioli, Pozzo d'adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 12 days.

(21) Appl. No.: 14/228,370

(22) Filed: Mar. 28, 2014

(65) Prior Publication Data

US 2014/0291850 A1    Oct. 2, 2014

(30) Foreign Application Priority Data

Mar. 28, 2013   (IT) .............. MI2013A0473

(51) Int. Cl.
| | |
|---|---|
| *H01L 23/00* | (2006.01) |
| *B81C 1/00* | (2006.01) |
| *H01L 21/56* | (2006.01) |
| *H01L 25/065* | (2006.01) |
| *G01L 9/00* | (2006.01) |
| *G01L 19/00* | (2006.01) |
| *H01L 23/31* | (2006.01) |

(52) U.S. Cl.
CPC ............ *H01L 24/45* (2013.01); *B81C 1/0023* (2013.01); *G01L 9/0044* (2013.01); *G01L 19/0076* (2013.01); *H01L 21/561* (2013.01); *H01L 24/24* (2013.01); *H01L 24/48* (2013.01); *H01L 24/82* (2013.01); *H01L 24/94* (2013.01);
(Continued)

(58) Field of Classification Search
CPC ......... H01L 24/45; H01L 24/82; H01L 24/24; H01L 24/97; H01L 21/561; H01L 25/0657; H01L 24/94; H01L 24/48; H01L 23/3114; H01L 24/29; H01L 24/16; H01L 24/73; H01L 24/32
See application file for complete search history.

(56) References Cited

U.S. PATENT DOCUMENTS

| | | |
|---|---|---|
| 5,872,393 A | 2/1999 | Sakai et al. |
| 6,455,927 B1 | 9/2002 | Glenn et al. |

(Continued)

OTHER PUBLICATIONS

Search Report for Italian patent application No. MI20130473, Munich, Germany, Jul. 23, 2013, 4 pages.
(Continued)

*Primary Examiner* — Jarrett Stark
(74) *Attorney, Agent, or Firm* — Seed IP Law Group LLP

(57) ABSTRACT

An embodiment for manufacturing electronic devices is proposed. The embodiment includes the following phases: a) forming a plurality of chips in a semiconductor material wafer including a main surface; each chip includes respective integrated electronic components and respective contact pads facing the main surface; said contact pads are electrically coupled to the integrated electronic components; b) attaching at least one conductive ribbon to at least one contact pad of each chip; c) covering the main surface of the semiconductor material wafer and the at least one conductive ribbon with a layer of plastic material; d) lapping an exposed surface of the layer of plastic material to remove a portion of the plastic material layer at least to uncover portions of the at least one conductive ribbon, and e) sectioning the semiconductor material wafer to separate the chips.

14 Claims, 9 Drawing Sheets

(52) U.S. Cl.
CPC .......... *H01L 24/97* (2013.01); *H01L 25/0657*
(2013.01); *H01L 23/3114* (2013.01); *H01L
24/16* (2013.01); *H01L 24/29* (2013.01); *H01L
24/32* (2013.01); *H01L 24/73* (2013.01); *H01L
2224/0346* (2013.01); *H01L 2224/0401*
(2013.01); *H01L 2224/05569* (2013.01); *H01L
2224/05611* (2013.01); *H01L 2224/16145*
(2013.01); *H01L 2224/2405* (2013.01); *H01L
2224/2919* (2013.01); *H01L 2224/32145*
(2013.01); *H01L 2224/45014* (2013.01); *H01L
2224/45032* (2013.01); *H01L 2224/45124*
(2013.01); *H01L 2224/45144* (2013.01); *H01L
2224/45147* (2013.01); *H01L 2224/48145*
(2013.01); *H01L 2224/48611* (2013.01); *H01L
2224/48711* (2013.01); *H01L 2224/48811*
(2013.01); *H01L 2224/73207* (2013.01); *H01L
2224/73265* (2013.01); *H01L 2224/8293*
(2013.01); *H01L 2224/85205* (2013.01); *H01L
2224/94* (2013.01); *H01L 2224/97* (2013.01);
*H01L 2225/06506* (2013.01); *H01L
2225/06513* (2013.01); *H01L 2225/06568*
(2013.01); *H01L 2924/00014* (2013.01); *H01L
2924/12042* (2013.01); *H01L 2924/1433*
(2013.01); *H01L 2924/1461* (2013.01); *H01L
2924/181* (2013.01)

(56) References Cited

U.S. PATENT DOCUMENTS

| | | | | |
|---|---|---|---|---|
| 6,841,414 B1 * | 1/2005 | Hu | ................... | H01L 21/4828 257/E23.124 |
| 6,872,599 B1 | 3/2005 | Li et al. | | |
| 7,262,491 B2 | 8/2007 | Islam et al. | | |
| 7,439,100 B2 * | 10/2008 | Fauty | ................... | H01L 21/561 257/E23.021 |
| 7,671,459 B2 | 3/2010 | Corisis et al. | | |
| 7,785,929 B2 * | 8/2010 | Camacho | ............ | H01L 23/3135 257/787 |
| 8,493,748 B2 * | 7/2013 | Camacho | .......... | H01L 23/49551 361/760 |
| 2002/0031902 A1 | 3/2002 | Pendse et al. | | |
| 2004/0108580 A1 * | 6/2004 | Tan | ..................... | H01L 23/3107 257/678 |
| 2005/0012193 A1 | 1/2005 | Kameyama et al. | | |
| 2006/0148127 A1 | 7/2006 | Ong et al. | | |
| 2007/0111374 A1 | 5/2007 | Islam et al. | | |
| 2007/0161157 A1 * | 7/2007 | Islam | ................... | H01L 21/4832 438/120 |
| 2009/0085205 A1 * | 4/2009 | Sugizaki | ................ | B81B 7/007 257/737 |
| 2010/0000772 A1 * | 1/2010 | Letterman, Jr. | ....... | H01L 21/561 174/260 |
| 2010/0148340 A1 | 6/2010 | Takano et al. | | |

OTHER PUBLICATIONS

Farassat et al., "More Performance at Lower Cost—Heavy Aluminium Ribbon Bonding," F&K Delvotec Bandtechnik GMBH, Feb. 2007, 7 pages.

Damberg et al., "Fine Pitch Copper PoP for Mobile Applications," $62^{nd}$ Electronic Components and Technology Conference, May 29-Jun. 1, 2012, San Diego, CA, 7 pages.

Liu et al., "Novel Approaches of Wafer Level Packaging for MEMS Devices," $62^{nd}$ Electronic Components and Technology Conference, May 29-Jun. 1, 2012, San Diego, CA, 7 pages.

\* cited by examiner

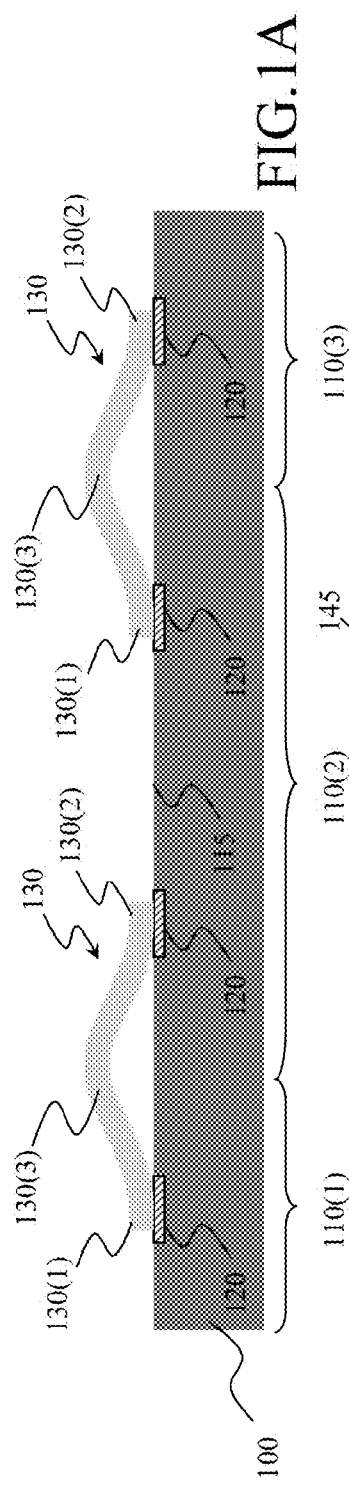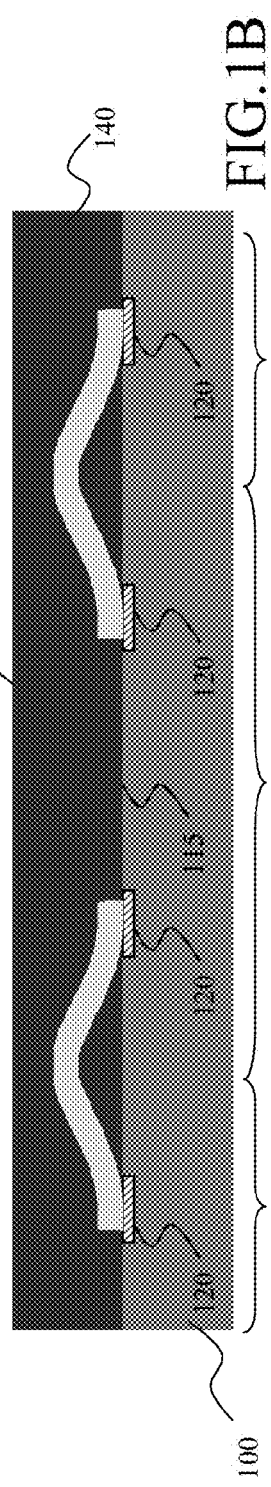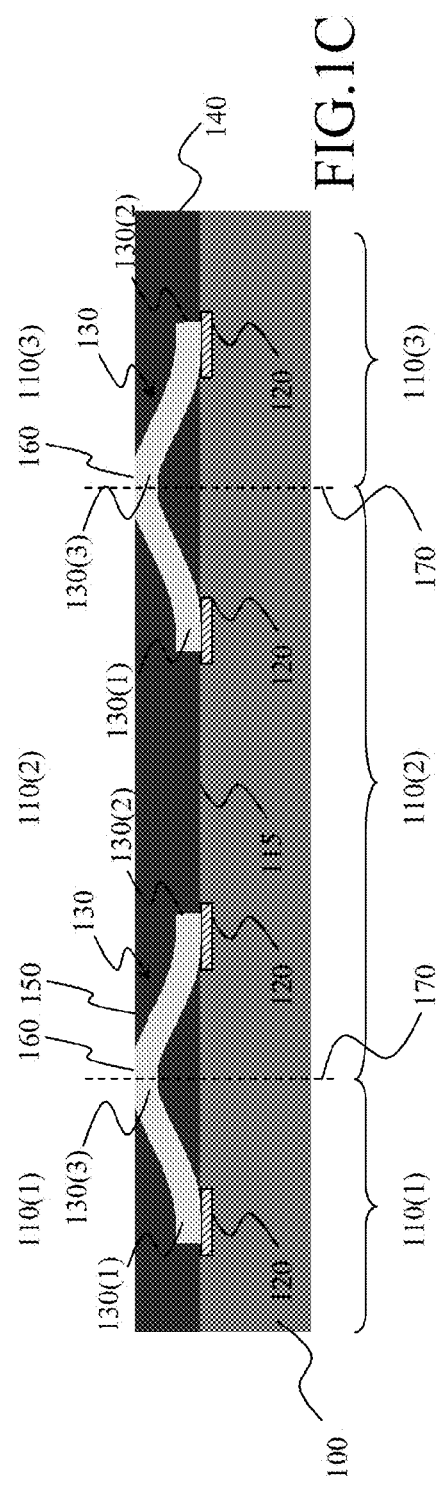

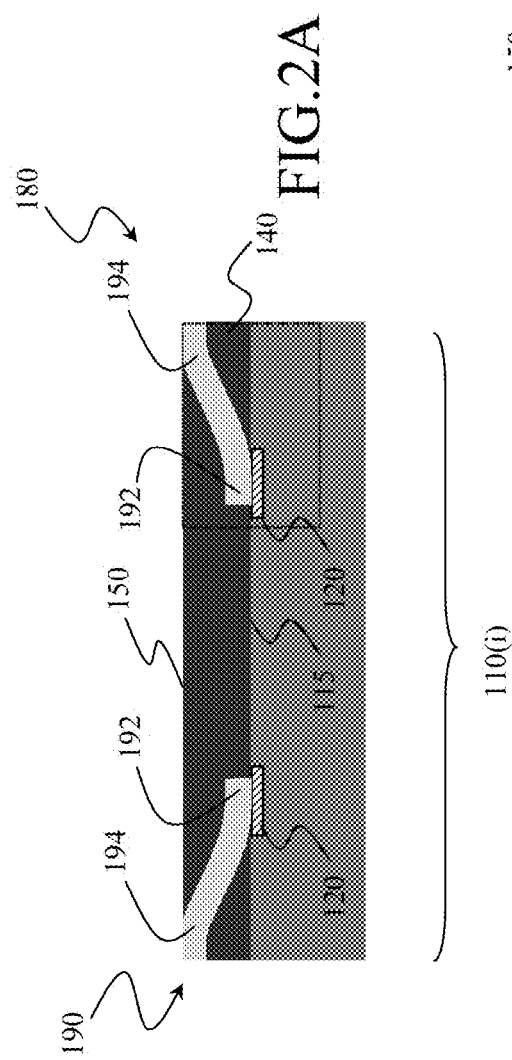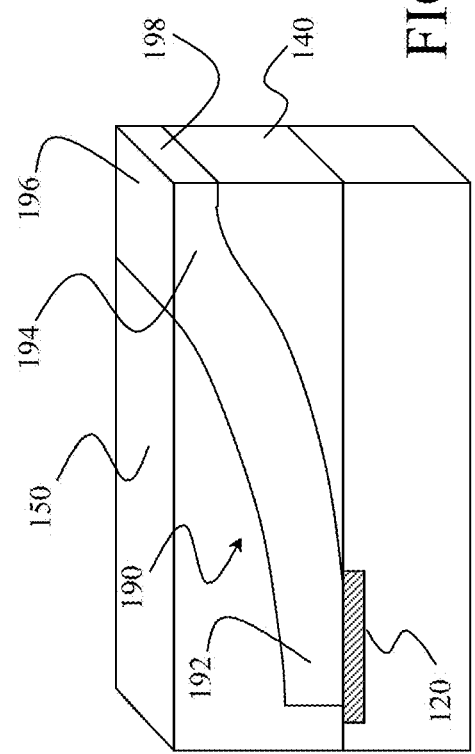

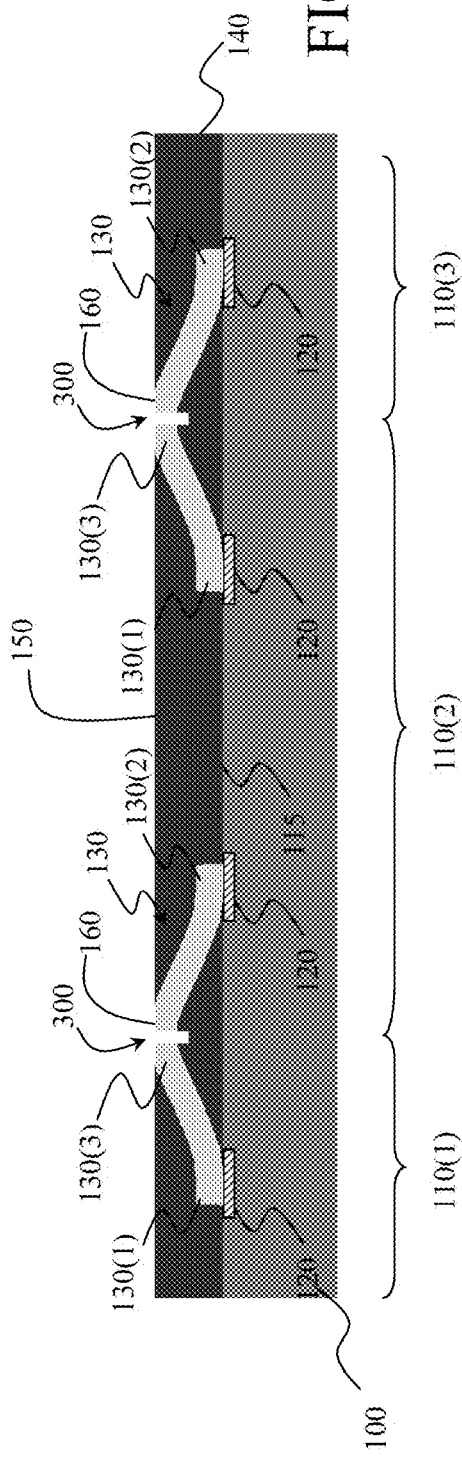

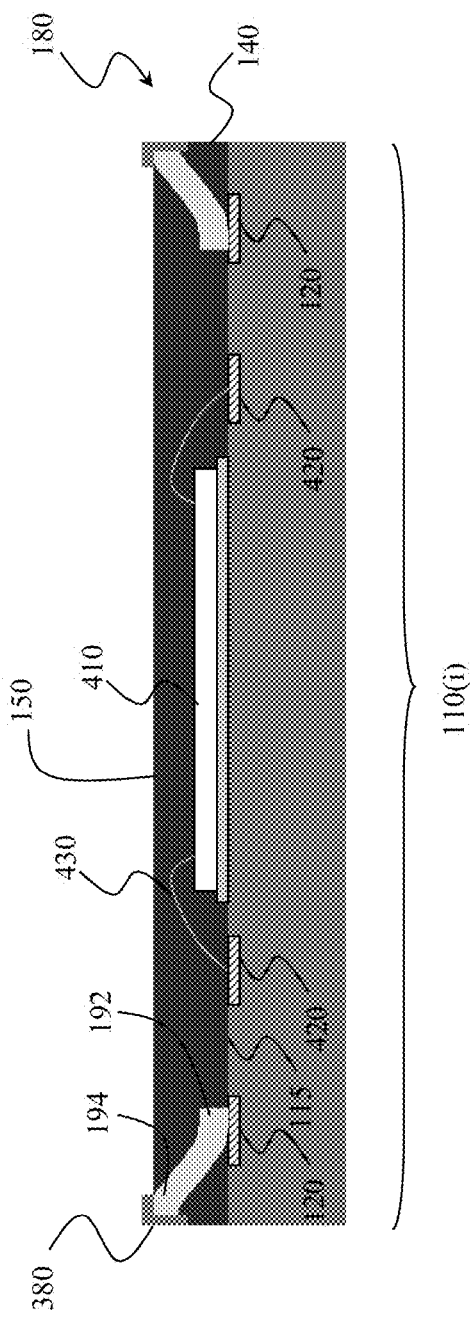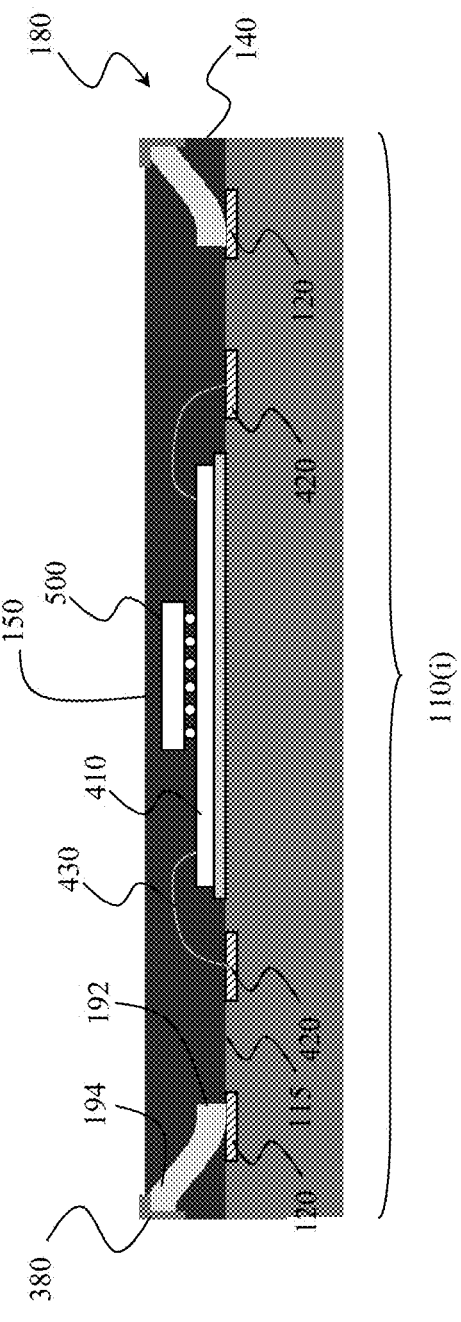

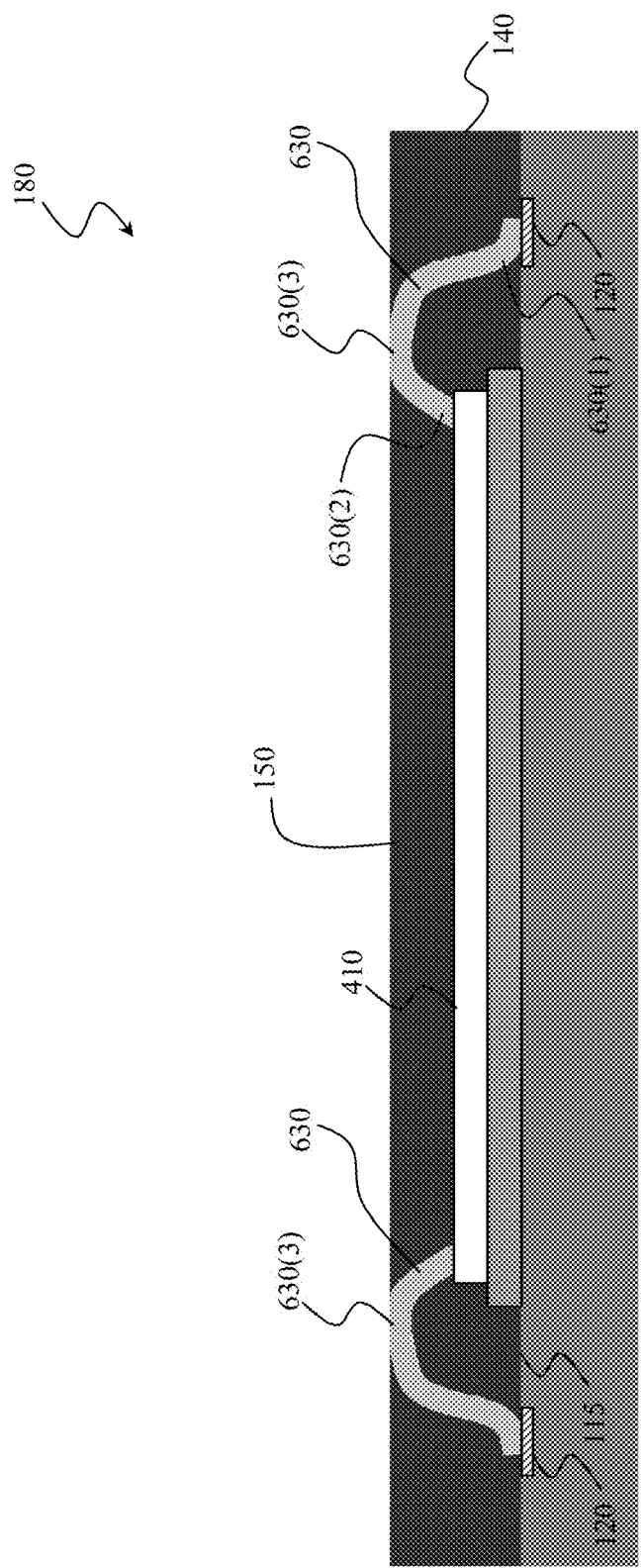

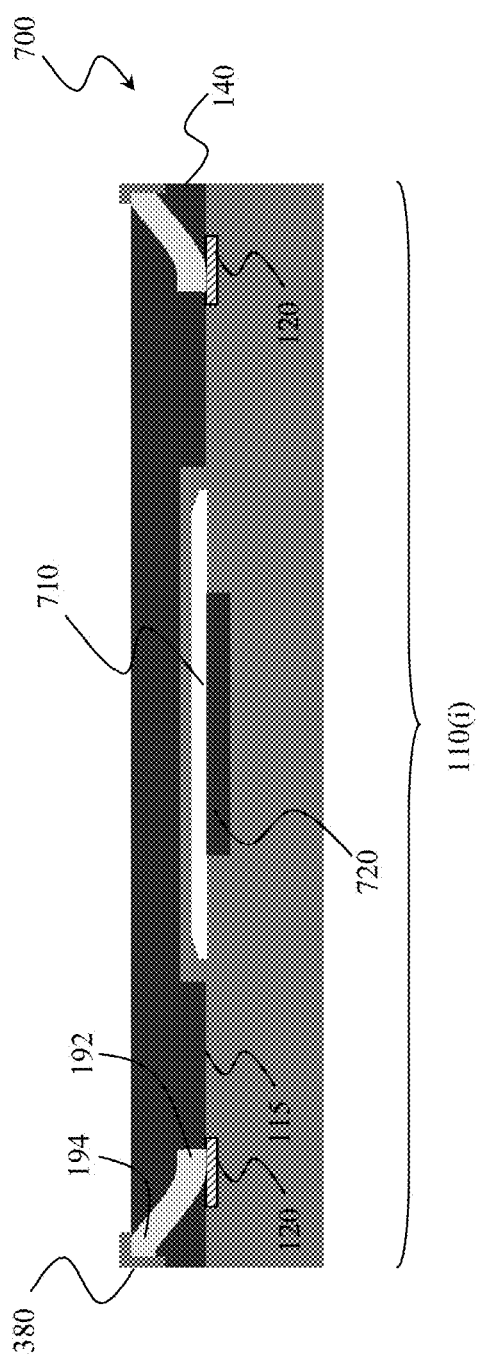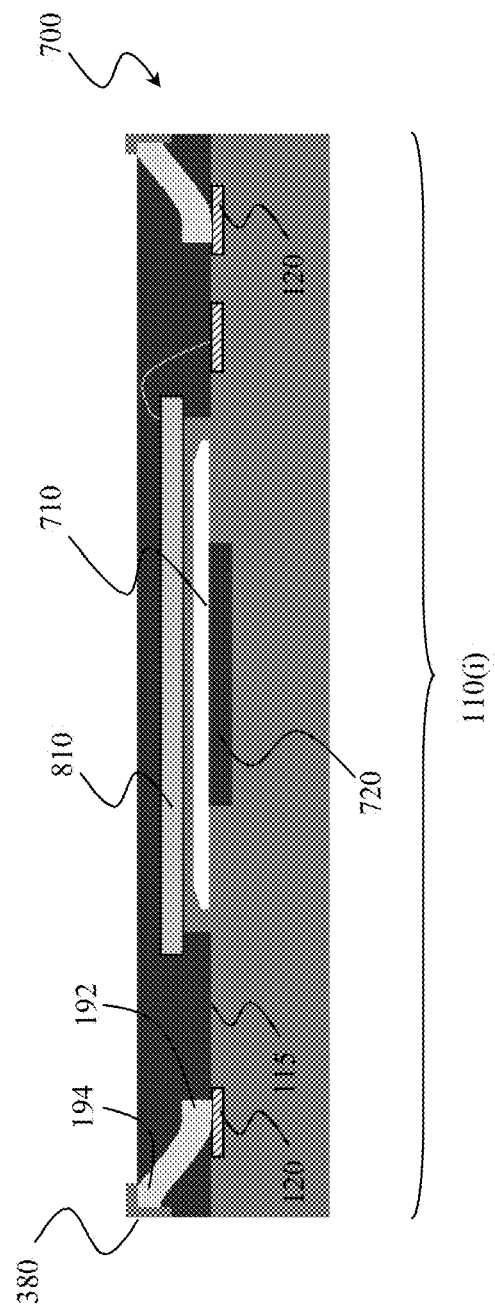

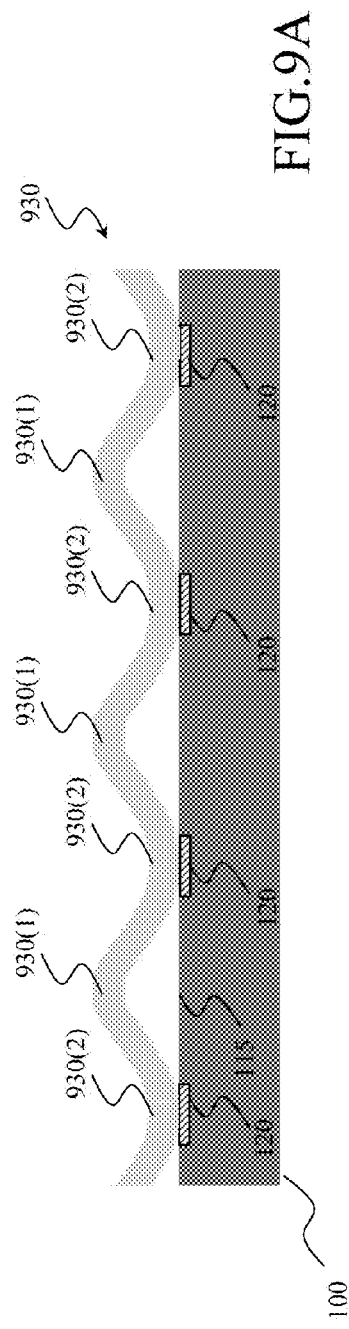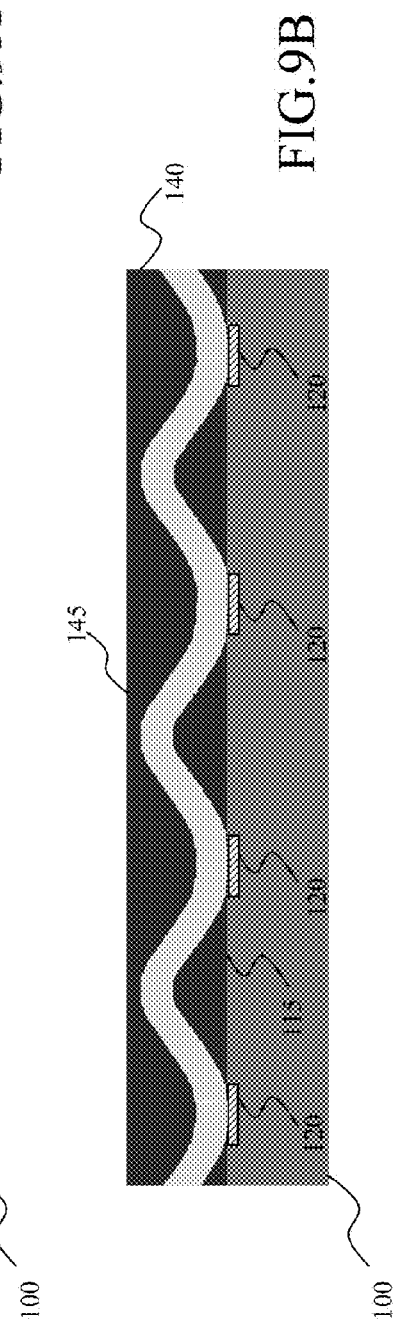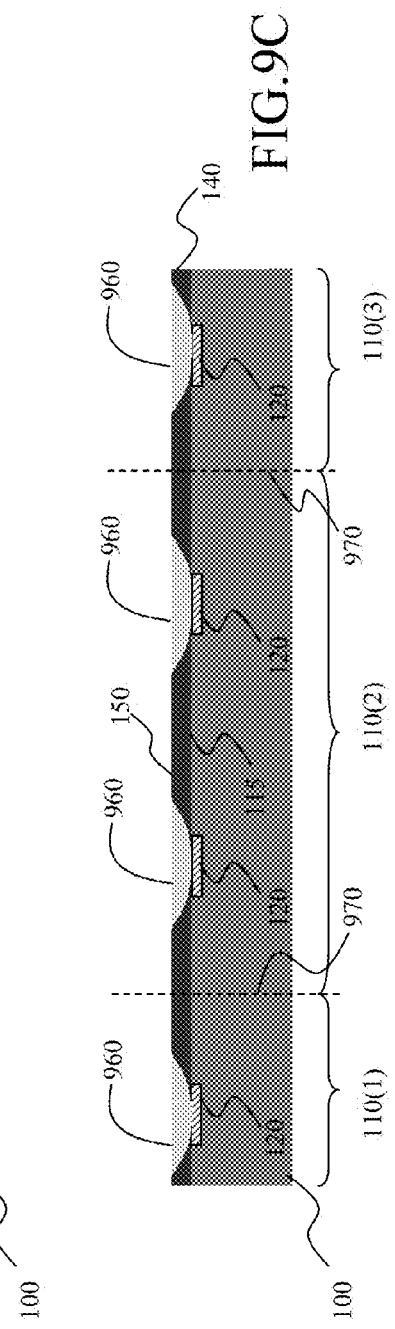

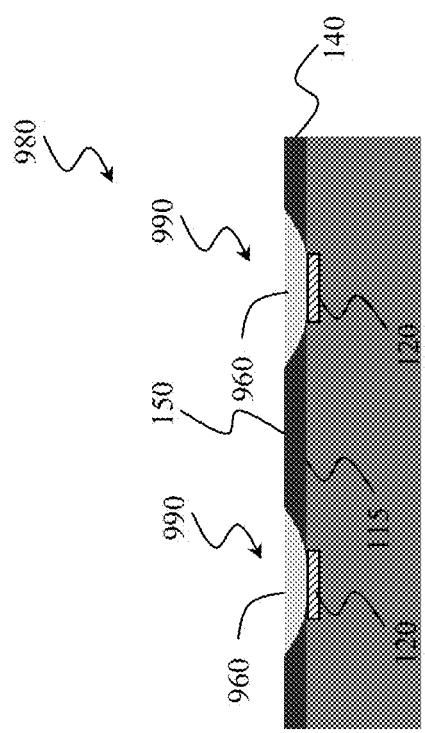

METHOD FOR MANUFACTURING ELECTRONIC DEVICES

PRIORITY CLAIM

The instant application claims priority to Italian Patent Application No. MI2013A000473, filed 28 Mar. 2013, which application is incorporated herein by reference in its entirety.

SUMMARY

An embodiment relates to the field of electronics. More in detail, an embodiment is a method for manufacturing electronic devices, and another embodiment is an electronic device manufactured according to this method.

In general, any electronic device includes a semiconductor material chip on which the real electronic components are integrated. The chip is typically encapsulated in a package including an insulating body, for example, in a plastic material, to be isolated and protected from the external environment. A single package may also be used to encapsulate more than one chip. The package includes conductive pins exposed from the insulating body, which pins are coupled to corresponding conductive terminals, known as contact pads, of the chip. The pins act as electrical interfacing elements between the chip and the external environment.

A typical industrial process for the production of chips provides for manufacturing a plurality of chips at the same time by means of a series of manufacturing operations on a semiconductor material wafer. Once formed, the chips are separated from the wafer by cutting the latter along scribe lines located between adjacent chips in the wafer. Similar considerations apply if instead of performing manufacturing operations on a single wafer, these operations are performed on a wafer sub-unit, or on a rebuilt-wafer, i.e., a plurality of chips glued on a temporary substrate.

The type of connection between the contact pads of the chips and pins exposed from the insulating body, as well as the type of the packages, depend on the application area of the electronic device.

A typical industrial process for manufacturing electronic devices also provides that a high number of chips are encapsulated at the same time in corresponding packages through the execution of the following sequence of operations.

+Making, for example, reference to a Surface-Mounting Technology (SMT) electronic device, the first operation provides for using a common support structure (leadframe) in conductive material, for example copper, including for each electronic device to be assembled a corresponding support cell including a support substrate for the chip and junction sacrificial portions surrounding the support substrate. Pin blocks (precursors of pins in the electronic devices) extend from the junction sacrificial portions towards the support substrate. In the support structure, the support substrates, the junction sacrificial portions, and the pin blocks of all the electronic devices are coupled to each other to form a single body (leadframe).

The next operation requires that each support substrate of the support structure is coupled to a respective semiconductor material chip. This operation is called in jargon "die attach". For example, in the case of electronic devices for signal applications, this phase typically involves the use of epoxy glue.

The contact pads of each chip are then electrically coupled to the ends of corresponding pin blocks in the support structure, for example, by means of wires having a circular cross section or interconnecting straps made of conductive material and having a rectangular cross section. In jargon, this operation is called "wire bonding".

The next operation provides for encapsulating the chips in insulating bodies; such operation can be performed, for example, through injection molding of plastic material onto the support structure. This operation is called in jargon "molding operation".

The next operation, called in jargon "cropping operation", provides for separating the electronic devices from the support structure by cutting the pin blocks along a section plane. In this way, the electronic device has a plurality of pins exposed from the insulating body obtained from the pin blocks. In particular, each pin is a portion of a respective pin block of the support structure obtained as a result of the sectioning carried out during the cropping. Depending on the position of the section planes with respect to the insulating body, the resulting pins may protrude, or not, from the resulting insulating body (in the second case, the pins are simply surfaces exposed from the insulating body). In the case where the electronic device includes Land Grid Array (LGA) or Quad-Flat No-leads (QFN) packages, this operation is called in jargon "sawing operation", and provides for a real cut made by means of a blade.

The electronic device is now ready to be mounted on a Printed Circuit Board (PCB). For example, the pins are coupled by means of solder pastes to corresponding conductive tracks of the printed circuit board by means of a slight pressure, and are then welded on the same by melting the solder paste.

In the case of pins protruding from the insulating body, it is known to cover the exposed portions of the pin blocks with a soldering material (for example tin) before performing the cropping operation.

Further types of electronic devices are known.

For example, an electronic device of Pin Grid Array (PGA) type has pins that protrude from the lower (mounting) face of the insulating body; electronic devices of this type are mounted on printed circuit boards by inserting the pins in through holes or sockets made on the printed circuit board.

An electronic device of the Ball Grid Array (BGA) type instead uses a grid of solder balls located on the lower face of the insulating body as a means of electrical connection between the chip and the exterior of the package. The solder balls include welding material, and are coupled to a substrate included in the insulating body. The chip may be electrically coupled to the substrate by wire bonding, or with techniques such as the one of the flip-chip type.

In electronic devices assembled by means of wire bonding, the wires that couple the contact pads of the chip to the pins of the package are not capable of handling currents that are too high, due to their substantially reduced cross section (typically, a few tens of micrometers ($\mu$m)). Consequently, these devices are ill-suited for power applications. Furthermore, the wires typically cannot be used to provide power-supply voltages to the supply pads of the chip.

To solve these drawbacks, it is known to couple each contact pad of the chip intended to receive/deliver high amounts of current and/or receive a supply voltage to the corresponding pin by a plurality of wires in parallel, this combination of wires having a larger effective cross-section than a single wire. However, a solution of this type may have the disadvantage of greatly increasing the costs of the wire bonding operation, thereby increasing the overall manufacturing costs.

On this regard, solutions were studied to replace the wires with conductive ribbons (in jargon, "ribbon bonding"), for example made of aluminium. Such ribbons have a cross section corresponding to different wires (e.g., a hundred pm). However, a solution of this type may have the disadvantage that the common support structure (leadframe) used during the manufacturing process of the electronic device must exhibit pin blocks wide enough to allow coupling with the ribbons. Consequently, the overall size of the electronic device increases significantly.

An embodiment relates to a method for the production of integrated devices, the embodiment not suffering from the drawbacks mentioned above.

An example of said method includes the following phases:

a) forming a plurality of chips in a semiconductor material wafer including a main surface; each chip includes respective integrated electronic components and respective contact pads facing the main surface; said contact pads are electrically coupled to the integrated electronic components;

b) attaching at least one conductive ribbon to at least one contact pad of each chip;

c) covering the main surface of the semiconductor material wafer and the at least one conductive ribbon with a layer of plastic material;

d) lapping an exposed surface of the plastic material layer to remove a portion of the layer of plastic material at least to uncover portions of the at least one conductive ribbon, and e) sectioning the semiconductor material wafer to separate the chips.

A further embodiment relates to an electronic device.

BRIEF DESCRIPTION OF THE DRAWINGS

One or more embodiments, as well as additional features and advantages, will be best understood by reference to the following detailed description, given purely by way of indicative and non-limiting example, to be read in conjunction with the accompanying figures (in which corresponding elements are indicated with the same or similar references and their explanation is not repeated for brevity). In this respect, it is expressly understood that the figures are not necessarily to scale (with some details that may be exaggerated and/or simplified) and that, unless otherwise indicated, they are simply used to conceptually illustrate the structures and procedures described.

FIGS. 1A-1C are cross-sectional views of a portion of a semiconductor material wafer during some phases of a method in accordance with an embodiment.

FIG. 2A is a cross-sectional view of an electronic device manufactured by following the phases of the method of FIGS. 1A-1C, according to an embodiment.

FIG. 2B is a view of a detail of the device of FIG. 2A, according to an embodiment.

FIGS. 3A-3C are cross-sectional views of a portion of a semiconductor material wafer during some phases of a method in accordance with another embodiment.

FIGS. 4-6 are cross-sectional views of electronic devices in accordance with embodiments.

FIGS. 7 and 8 are cross-sectional views of electronic devices including micro-electro-mechanical systems in accordance with embodiments.

FIGS. 9A-9C are cross-sectional views of a portion of a semiconductor material wafer during some phases of a method in accordance with another embodiment.

FIG. 9D is a cross-sectional view of an electronic device manufactured by following the phases of the method of FIGS. 9A-9C, according to an embodiment.

DETAILED DESCRIPTION

Figure 3C:
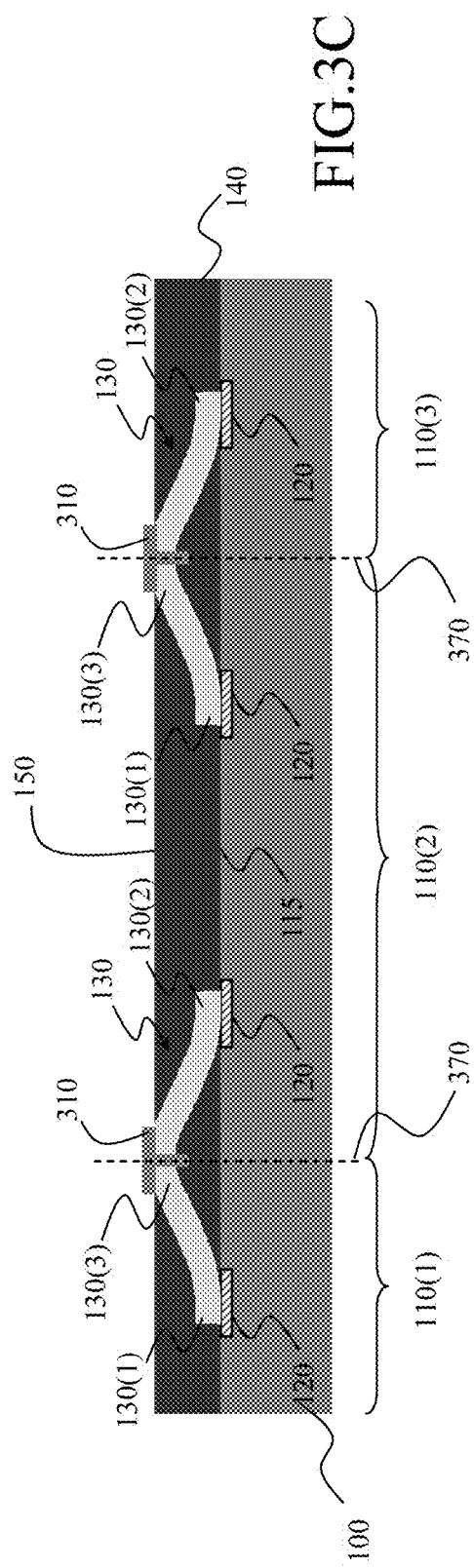

There will now be described in detail main phases of a method for the manufacturing of electronic devices in accordance with various embodiments.

A first embodiment is illustrated in FIGS. 1A-1C and FIGS. 2A and 2B. FIGS. 1A-1C are cross-sectional views of a portion of a wafer 100 made of semiconductor material (e.g., monocrystalline silicon) during some of the phases of the proposed method, according to an embodiment. FIG. 2A is a cross-sectional view of an electronic device manufactured by following the phases of this proposed method, while FIG. 2B is a view of a detail of the device of FIG. 2A, according to an embodiment.

The proposed method firstly provides for performing (standard) process operations for the formation of chips up to the phase preceding the separation of chips from the wafer 100. As is well known to experts in the field, such operations include the application of known techniques of epitaxial growth, deposition, ion implantation, photolithography and diffusion on/through a main surface of the wafer 100, the surface being identified with the reference 115. FIG. 1A is a very simplified cross-sectional view of a portion of the wafer 100 manufactured up to the phase preceding the separation of chips, in which three adjacent chips 110($i$) ($i$=1, 2, 3) are visible. Each chip 110($i$) includes one or more integrated electronic components (not shown), and one or more contact pads 120 electrically coupled to the integrated electronic components.

At this point, according to an embodiment, conductive strips/ribbons 130 are secured between pairs of contact pads 120 of adjacent chips in the wafer 100, in such a way that each conductive ribbon 130 has a first end 130(1) attached to a contact pad 120 of a chip, a second end 130(2) attached to a contact pad 120 of an adjacent chip, and a raised central portion 130(3) that extends away from the main surface 115 of the wafer 100. In the example illustrated in FIG. 1A, a first conductive ribbon 130 has a first end 130(1) that is attached to a contact pad 120 of the chip 110(1) and a second end 130(2) that is attached to a contact pad 120 of the chip 110(2), while a second conductive ribbon 130 has a first end 130(1) attached to a contact pad 120 of the chip 110(2) and a second end 130(2) attached to a contact pad 120 of the chip 110(3).

According to an embodiment, the conductive ribbons 130 are made of metallic material, such as aluminium, gold, or copper. The size of the conductive strips 130 depends on the amount of current intended to be delivered to/from the electronic components integrated in the chips 110($i$) through the contact pads 120, which in turn depends on the use to which such chips 110($i$) are intended. For example, a conductive ribbon 130 having a thickness (along the direction approximately perpendicular to the main surface 115) between one or two tens and hundreds of μm, for example between 70 and 100 μm, and a width (along the direction perpendicular to the surface of the sheet of FIGS. 1A-1B) equal to a few hundreds of pm, for example between 200 μm and a millimeter (mm), is adapted to handle currents of the order of up to tens of Amperes (A). For example, a ribbon having a thickness of 100 μm and a width of 1 mm is capable of supporting current values equal to about 80-90 A.

The attaching of the ends 130(1), 130(2) of the conductive ribbons 130 to the contact pads 120 may be made according to any conventional attaching technique, for example, by applying a combination of heat, pressure, and ultrasonic energy.

The length of each conductive ribbon 130 is such that, once the ends 130(1), 130(2) are attached to the corresponding contact pads 120, the conductive ribbon 130 forms a wave, with the central portion 130(3) that is raised with respect to the main surface 115, so as to leave a free space between the central portion 130(3) and the main surface 115.

The next phase of the method, illustrated in FIG. 1B, provides that the wafer 100 is subjected to a molding operation, direct to cover both the main surface 115 of the wafer 100 and the conductive ribbons 130 with a layer of plastic material 140, or another suitable material. This operation may, for example, provide for an injection molding of plastic material directly executed on the wafer 100. During this phase, the free spaces between the central portion 130(3) and the main surface 115 are also filled with the deposed plastic material 140.

At this point, the exposed surface 145 of the layer of plastic material 140 just deposed is subjected to a lapping operation (e.g., chemical-mechanical polishing (CMP)), for example by means of grinding, so as to remove a part of plastic material from the layer sufficient to expose at least the central portion 130(3) of the conductive ribbons 130. For example, the lapping is made to continue beyond the highest surface of the central portions 130(3) to remove at least a corresponding part of the central portions 130(3) of the conductive ribbons. As shown in FIG. 1C, the exposed surface of the layer of plastic material 140—identified with the reference 150—resulting from the lapping operation is a flat surface, approximately parallel to the main surface 115 of the wafer 100, which exposes conductive surfaces 160, which are substantially rectangular in a plane approximately parallel to the surface 150, and which are obtained by the lapping of the central portions 130(3) of the conductive ribbons 130.

The wafer 100 is then sectioned along section planes 170 approximately perpendicular to the surfaces 150 and 115 and passing through the conductive surfaces 160, so as to separate the chips 110(i).

FIG. 2A is a cross-sectional view of an electronic device 180 obtained by the method just described in conjunction with FIGS. 1A-1C. The electronic device 180 includes a semiconductor material chip 110(i), an insulating body formed by the layer of plastic material 140, and conductive pins 190 exposed from the insulating body and coupled to corresponding contact pads 120 of the chip 110(i). Each pin 190 includes a contact portion 192 enclosed in the insulating body and coupled to the contact pad 120, and an end portion 194 exposed from the insulating body. The contact portion 192 includes one of the two ends 130(1), 130(2) of the conductive ribbon 130, which originated the pin 190, while the end portion 194 includes a part of central portion 130(3) of the conductive ribbon 130. Referring to FIG. 2B, the end portion 194 includes a first exposed contact surface 196 approximately parallel to the surface 150, and a second exposed contact surface 198 approximately perpendicular to the first contact surface 196. The first contact surface 196 is a fraction of one of the conductive surfaces 160 obtained as a result of the lapping operation, while the second contact surface 198 corresponds to the part of the central portion 130(3) of the conductive ribbon 130 which is exposed by the insulating body following the sectioning of the wafer 100 along the section planes 170.

The electronic device 180 may then be mounted on a printed circuit board (not shown) in a simple and effective way, by turning the surface 150 toward the board and soldering the exposed parts of the terminal portions 194 of the pins 190—in particular, at least the first contact surfaces 196—to corresponding contact elements on the board. The second contact surfaces 198 that appear to be approximately perpendicular to the surface of the printed circuit board once the electronic device 180 is mounted on it, may be advantageously exploited to carry out conventional welding verifications in a simple and efficient way.

Thanks to the proposed method, the electronic device 180 has been produced without the use of any additional common support structure (lead frame), it being sufficient to exploit the particular configuration in which the conductive strips 130 are embedded in the insulating body. This may allow a considerable reduction in the overall size of the electronic device 180. In an embodiment, the pins 190 obtained with the described method possess all the advantageous characteristics of the conductive ribbons. Thanks to their not-negligible cross sections, the pins 190 are able to handle high currents, and are, therefore, adapted to be used in power applications and/or to manage supply voltages.

In accordance with a further embodiment (not shown in the figures), instead of attaching the two ends 130(1) and 130(2) of each conductive ribbon 130 to two respective contact pads 120 (belonging to two different chips 110(i)), only one of the two ends of the conductive ribbon 130 is coupled (welded) to a contact pad 120, while the other end is left free; in this case, once the wafer 100 has been sectioned in correspondence of the conductive surfaces 160, the part of the wafer including the unattached end of the ribbon is discarded. Alternatively, the wafer 100 may be sectioned along section planes that do not intercept the conductive ribbons 130; in this case, each conductive surface 160 may act as a contact pad for the device 180.

According to an embodiment, the conductive ribbons 130 are dual-layer, with a lower layer (facing the surface 115 of the chip) in aluminium, gold, or silver, and an upper layer (facing the opposite direction) in copper. In this way, the resulting resistance of the pins 190 may be further decreased, and the surfaces of the pins 190 exposed from the layer of plastic material 140 appear to have similar physical characteristics to those of the pins obtained by means of standard procedures that use common support structures (leadframe).

In accordance with an embodiment, to improve and make easier the welding of the electronic device 180 on the insulating body, the exposed surfaces of the pins 190 are coated with a welding material (for example tin). In accordance with this embodiment, the method proceeds as previously described up to the lapping phase (situation illustrated in FIG. 1C).

At this point, as shown in FIG. 3A, the method provides carrying out a partial incision at each exposed conductive surface 160, forming cavities 300 that vertically cross the central portions 130(3) of the conductive ribbons 130 and part of the underlying layer of plastic material 150, but without reaching the surface 115 of the wafer 100. This partial etching may, for example, be done by exploiting a blade or laser ablation.

In the next phase, illustrated in FIG. 3B, welding material is selectively deposited (for example, by plating) on the surface 150 in correspondence of the cavities 300 so as to form filler structures 310. Each filler structure 310 has substantially a "T" shape, with a vertical portion which extends approximately perpendicularly to the surface 150, filling the corresponding cavity 300, and a horizontal portion which extends parallel to the surface 150 covering the conductive surface 160 where it is localized about cavity 300.

As illustrated in FIG. 3C, the wafer 100 is then sectioned along section planes 370 approximately perpendicular to the surfaces 150 and 115 and passing through the filler structures 310, in particular along the axis of symmetry of the vertical portions of them, so as to separate the chips 110 (*i*).

Figure 3D:
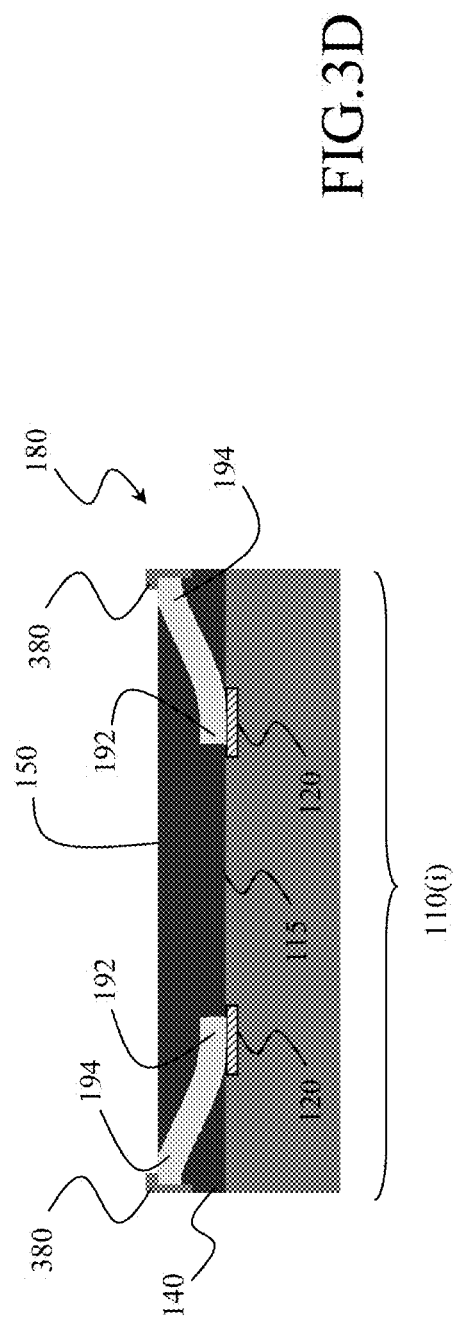
FIG. 3D is a cross-sectional view of an electronic device manufactured by following the phases of the method of FIGS. 3A-3C, according to an embodiment.

The resulting electronic devices 180, one of which is illustrated in FIG. 3D, have consequently conductive pins 190 with end portions 194 having both the first contact surface 196 and the second contact surface 198 partially or fully covered by a layer of welding material 380, obtained by halving the filler structures 310 as described above.

The method just described may also be used to produce electronic devices including more than one chip.

For example, according to an embodiment illustrated in FIG. 4, the layer of plastic material 140 also covers a second chip 410 on which are integrated electronic components (not shown). The second chip 410 is attached on the surface 115 of the chip 110(*i*) using standard methods, such as using glues or by means of Die Attach Film (DAF), and is electrically coupled to contact pads 420 of the chip 110(*i*) by means of conductive wires 430 (wire bonding). According to an embodiment (not shown), the contact pads 420 for the coupling of the conductive wires 430 may be coupled to the contact pads 120 for the coupling of the conductive ribbons 130 by means of strips of conductive material formed directly on the surface of chip 110(*i*).

In accordance with a further embodiment illustrated in FIG. 5, a third chip 500 is disposed on and attached to the second chip 410, for example by a flip-chip technique using solder balls.

In accordance with an embodiment illustrated in FIG. 6, in which a second chip 410 is attached on the surface 115 of the chip 110(*i*), conductive ribbons 630 are arranged with a first end 630(1) attached to a contact pad of the chip 110(*i*), a second end 630(2) attached to a contact pad of the second chip 410, and a central portion 630(3) with a conductive surface 660 exposed from the surface 150 of the layer of plastic material 140 and which acts as a pin for the electronic device.

The proposed method is suitable to be used also for the manufacture of electronic devices including Micro-Electro-Mechanical Systems (MEMS), such as the electronic device 700 shown in FIG. 7, including a cavity 710 within which a MEMS chip 720, or the electronic device 800 shown in FIG. 8, further including another chip 810 attached above the cavity 710. In the case in which the cavity 710 is at least partially exposed from the layer of plastic material 140, the electronic device may be advantageously used as a pressure sensor.

In all embodiments described up to now, the pins of the electronic device 180 are obtained from the central portions of the conductive ribbons. For example, in the embodiment illustrated in FIGS. 2A and 2B, the pins 190 have the end portion 194 that includes a part of the central portion 130(3) of the conductive ribbon 130, while in the embodiment illustrated in FIG. 6, the pins include a conductive surface 660 resulting from the central portion 630(3) of the conductive ribbons 630.

In a method illustrated in FIGS. 9A-9C according to an embodiment, which will now be described, the pins of the electronic device 180 are obtained using portions of the ribbons different from the raised central portions.

In detail, referring to FIG. 9A, in accordance with an embodiment, conductive ribbons 930 (only one visible in the figure) are arranged on the wafer 100 according to a wavy configuration, so as to present a succession of alternating ridges 930(1) and depressions 930(2). For each conductive ribbon 930, each depression 930(2) is attached to a corresponding contact pad of a chip 110(*i*). In this way, each ridge 930(1) of the conductive ribbon 930 is raised with respect to the main surface 115 of the wafer 100, forming a corresponding free space.

At this point, as shown in FIG. 9B, the wafer 100 is subjected to a molding operation, directed to cover both the main surface 115 of the wafer 100 and the conductive ribbons 930 with a layer of plastic material 140, also filling the free spaces between the ridges 930(1) and the main surface 115.

The exposed surface 145 of the layer of plastic material 140 just deposed is then subjected to a lapping operation, so as to remove a part of the plastic material from the layer and the ridges 930(1) of the conductive ribbons 930, so that each depression 930(2) turns out to be separated from the other depressions 930(2) of the same ribbon. For example, the lapping is made to continue further up to remove at least a corresponding part of each depression 930(2) of the conductive ribbons 930. As shown in FIG. 9C, the exposed surface 150 of the layer of plastic material 140 resulting from the lapping operation is a flat surface, approximately parallel to the main surface 115 of the wafer 100, which exposes conductive surfaces 960 substantially rectangular obtained by lapping the depressions 930(2) of the conductive ribbons 930.

The wafer 100 is then sectioned along section planes 970 approximately perpendicular to the surfaces 150 and 115, so as to separate the chips 110(*i*).

FIG. 9D is a sectional view of an electronic device 980 obtained by the method phases illustrated in FIGS. 9A-9C. The electronic device 180 includes a semiconductor material chip 110(*i*), an insulating body formed by the layer of plastic material 140, and conductive pins 990 exposed from the insulating body and coupled to corresponding contact pads 120 of the chip 110(*i*). Each pin 990 includes the remaining portions of the depressions 930(2) of the conductive ribbon 930 as a result of the lapping operation, and the conductive surfaces 960.

Naturally, to satisfy contingent and specific requirements, one may make numerous modifications and variants to the above-described embodiments.

For example, the number, shape and/or arrangement of the pins of the electronic devices may be different from those used in the description. The same argument can be applied to the insulating body, which may have a different form from that described.

Furthermore, an integrated circuit according to one of the above-described embodiments may be coupled to one or more other integrated circuits to form a system such as a smartphone, laptop computer, pad computer, or desktop computer, where at least one of the integrated circuits is a computing circuit such as a microprocessor or a microcontroller. Moreover, the integrated circuits may be disposed on a single integrated-circuit die to form a system on a chip (SOC), or may be disposed among multiple integrated-circuit dies.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method, comprising:
    attaching a conductive ribbon to a first conductive pad that is disposed over a substrate;
    forming a layer of packaging material over the ribbon;
    removing a portion of the layer to form a first surface of the layer and a second surface of the layer that is approximately orthogonal to the first surface of the layer, the removing the portion of the layer exposing a first contact surface of the ribbon that is approximately coplanar with the first surface of the layer and exposing a second exposed contact surface of the ribbon that is approximately coplanar with the second surface of the layer to form a contact region including the first and second contact surfaces;
    wherein attaching the conductive ribbon includes:
        attaching a first end of the conductive ribbon to the first pad;
        attaching a second end of the conductive ribbon to a second conductive pad that is disposed over the substrate and such that a midsection of the ribbon is farther from the substrate than the first and second ends;
    wherein removing the portion of the layer includes removing the portion of the layer to expose the midsection of the ribbon;
    removing a portion of the midsection to form the contact region;
    cutting through the midsection of the ribbon, the layer of packaging material, and the substrate to form an integrated circuit;
    forming a cavity through the contact region; and
    forming a conductive T-shaped filler structure in the cavity, the T-shaped filler structure including a vertical portion extending within the cavity and horizontal portions extending on the contact region.

2. The method of claim 1, wherein forming the cavity through the contract region comprises forming the cavity through cutting or laser ablation of the contact region.

3. The method of claim 1, wherein forming the conductive T-shaped filler structure in the cavity comprises selectively depositing welding material on the contact region.

4. The method of claim 1, wherein the vertical portion includes an axis of symmetry and wherein cutting through the midsection of the ribbon, the layer of packaging material, and the substrate to form an integrated circuit comprises cutting through the axis of symmetry of the vertical portion.

5. The method of claim 1, wherein forming the layer of packaging material over the ribbon comprises forming a layer of plastic material over the ribbon.

6. The method of claim 5, wherein forming the layer of plastic material over the ribbon comprises injection molding the layer of plastic material on the ribbon and the substrate.

7. A method, comprising:
    attaching a conductive ribbon to a first conductive pad that is disposed over a substrate;
    forming a layer of packaging material over the ribbon;
    removing a portion of the layer to form a first surface of the layer and a second surface of the layer that is approximately orthogonal to the first surface of the layer, the removing the portion of the layer exposing a first contact surface of the ribbon that is approximately coplanar with the first surface of the layer and exposing a second exposed contact surface of the ribbon that is approximately coplanar with the second surface of the layer to form a contact region including the first and second contact surfaces;
    wherein attaching the conductive ribbon includes:
        attaching a first end of the conductive ribbon to the first conductive pad, and
        attaching a second end of the conductive ribbon to a second conductive pad that is disposed over the substrate and such that a midsection of the ribbon is farther from the substrate than the first and second ends;
    wherein removing the portion of the layer includes removing the portion of the layer to expose the midsection of the ribbon;
    removing a portion of the midsection to form the contact region;
    forming a cavity through the contact region and extending into a portion of the packaging material under the contact region but not extending to a surface of the substrate; and
    forming a conductive material in the cavity.

8. The method of claim 7, wherein forming the conductive material in the cavity comprises selectively depositing welding material to form a T-shaped filler structure having a vertical portion extending in the cavity and a horizontal portion on at least a portion of a surface of the contact region.

9. A method for manufacturing electronic devices, comprising:
    attaching a plurality of chips to a main surface of a semiconductor material wafer, the semiconductor material wafer including a plurality of contact pads exposed on the main surface and each chip being electrically coupled to at least some of the plurality of contact pads;
    attaching a conductive ribbon to at least one contact pad, the conductive ribbon including a first end, a second end, and a midsection portion that is further from the main surface of the semiconductor material wafer than the first and second ends and wherein attaching the at conductive ribbon includes attaching each of the first and seconds ends to at least one of the plurality of contact pads;
    forming a layer of packaging material on the conductive ribbon and the main surface of the semiconductor material wafer;
    removing a portion of the layer of packaging material to expose the midsection portion of the conductive ribbon;
    removing a portion of the midsection portion of the conductive ribbon to form a contact region;
    forming a cavity through the contact region and extending into a portion of the packaging material under the contact region but not extending to a surface of the substrate;
    forming a conductive T-shaped filler structure in the cavity, the T-shaped filler structure including a vertical portion extending within the cavity and horizontal portions extending on the contact region; and
    cutting through the contact region, the T-shaped filler structure, the layer of packaging material, and the semiconductor material wafer to form a plurality of integrated circuits, each integrated circuit including a corresponding one of the plurality of chips.

10. The method of claim 9, wherein forming the cavity through the contract region comprises forming the cavity through cutting or laser ablation of the contact region.

11. The method of claim 9, wherein forming the T-shaped filler structure in the cavity comprises selectively depositing welding material on the contact region.

12. The method of claim 9, wherein forming the conductive T-shaped filler structure comprises forming the vertical portion having an axis of symmetry and wherein cutting through the contact region, the T-shaped filler structure, the layer of packaging material, and the semiconductor material wafer comprises cutting through the axis of symmetry of the vertical portion.

13. The method of claim 9, wherein forming the layer of packaging material comprises forming a layer of plastic material over the ribbon and the main surface of the semiconductor material wafer.

14. The method of claim 13, wherein forming the layer of plastic material comprises injection molding the layer of plastic material on the ribbon and the main surface of the semiconductor material wafer.

\* \* \* \* \*